US012581981B2

(12) United States Patent
Heinrich

(10) Patent No.: US 12,581,981 B2
(45) Date of Patent: Mar. 17, 2026

(54) METHOD OF FORMING AN INTERCONNECTION BETWEEN AN ELECTRIC COMPONENT AND AN ELECTRONIC COMPONENT

(71) Applicant: Infineon Technologies Austria AG, Villach (AT)

(72) Inventor: Alexander Heinrich, Bad Abbach (DE)

(73) Assignee: Infineon Technologies Austria AG, Villach (AT)

( * ) Notice: Subject to any disclaimer, the term of this patent is extended or adjusted under 35 U.S.C. 154(b) by 741 days.

(21) Appl. No.: 17/067,008

(22) Filed: Oct. 9, 2020

(65) Prior Publication Data

US 2021/0118842 A1 Apr. 22, 2021

(30) Foreign Application Priority Data

Oct. 16, 2019 (EP) .................................... 19203582

(51) Int. Cl.
*H01L 23/00* (2006.01)

(52) U.S. Cl.
CPC .............. *H01L 24/83* (2013.01); *H01L 24/27* (2013.01); *H01L 24/29* (2013.01); *H01L 2224/83203* (2013.01); *H01L 2224/8334* (2013.01)

(58) Field of Classification Search
CPC ..... H01L 2224/8334; H01L 2224/8381; H01L 2224/32503; H01L 2224/04026; H01L 2224/32227; H01L 2224/29019; H01L 2224/83193; H01L 2224/81894–81896; H01L 2224/80894–80896
See application file for complete search history.

(56) References Cited

U.S. PATENT DOCUMENTS

| | | | | |
|---|---|---|---|---|
| 2011/0241228 A1* | 10/2011 | Enomoto | ............. | C08G 59/686 257/793 |
| 2013/0256390 A1 | 10/2013 | Yamaguchi et al. | | |
| 2014/0154867 A1 | 6/2014 | Martinschitz et al. | | |
| 2015/0021792 A1* | 1/2015 | Escher-Poeppel | ...... | H01L 24/27 257/784 |
| 2015/0048523 A1* | 2/2015 | Suga | ....................... | H01L 24/13 228/104 |

(Continued)

FOREIGN PATENT DOCUMENTS

| | | |
|---|---|---|
| CN | 109592633 A | 4/2019 |
| WO | 2013161891 A1 | 10/2013 |

*Primary Examiner* — Julio J Maldonado
*Assistant Examiner* — Stanetta D Isaac
(74) *Attorney, Agent, or Firm* — Murphy, Bilak & Homiller, PLLC

(57) ABSTRACT

A method of forming an interconnection includes: providing an electronic component having a first main face and a first metallic layer disposed on the first main face; providing an electric component having a second main face and a second metallic layer disposed on the second main face, at least one of the first or second metallic layers including an oxide layer provided on a main face thereof; disposing a reducing agent on one or both of the electronic component and the electric component such that the reducing agent is enabled to remove the oxide layer; and connecting the electronic component to the electric component by directly connecting the first metallic layer of the electronic component with the second metallic layer of the electric component by applying pressure and heat.

16 Claims, 3 Drawing Sheets

(56)                    References Cited

U.S. PATENT DOCUMENTS

| | | | |
|---|---|---|---|
| 2016/0111395 A1* | 4/2016 | Heinrich | ............. H01L 23/4827 |
| | | | 438/107 |
| 2016/0126216 A1* | 5/2016 | Heinrich | ................. H01L 24/83 |
| | | | 257/782 |
| 2017/0086320 A1* | 3/2017 | Barber | ................. H05K 3/3463 |
| 2017/0170137 A1 | 6/2017 | Suganuma et al. | |
| 2019/0103378 A1 | 4/2019 | Escher-Poeppel et al. | |
| 2020/0291538 A1* | 9/2020 | Pielmeier | ................. C25D 7/12 |

* cited by examiner

METHOD OF FORMING AN INTERCONNECTION BETWEEN AN ELECTRIC COMPONENT AND AN ELECTRONIC COMPONENT

TECHNICAL FIELD

The present disclosure relates to a method of forming an interconnection between an electric component and an electronic component, and to an arrangement for a direct interconnect assembly.

BACKGROUND

Currently many die attach solutions based on the sintering of metallic nano- or micrometer sized particles are under investigation. These solutions have two shortcomings: the cost for the sintering paste is comparatively high and the dispensing or printing, drying and sintering processes are rather complex. Furthermore, the resulting interconnect is quite thick compared to a productive AuSn diffusion solder interconnect and hard and rigid due to the micro- or nanocrystallinity of the sintered material.

SUMMARY

According to a first aspect of the present disclosure a method of forming an interconnection between an electric component and an electronic component comprises providing an electronic component comprising a first main face, and a first metallic layer disposed on the first main face, providing an electric component comprising a second main face and a second metallic layer disposed on the second main face, wherein at least one of the first or second metallic layers comprises an oxide layer provided on a main face thereof, disposing a reducing agent on one or both of the electronic component and the electric component such that the reducing agent is enabled to remove the oxide layer, and connecting the electronic component to the electric component by directly connecting the first layer of the electronic component with the second layer of the electric component by applying pressure and heat.

According to a second aspect of the present disclosure, an arrangement for a direct interconnect chip assembly comprises an electronic component comprising a first main face and a first metallic layer disposed on the first main face, an electric component comprising a second main face and a second metallic layer disposed on the second main face, wherein the electronic component is connected to the electric component wherein the first metallic layer of the electronic component is directly connected with the second metallic layer of the electric component, and wherein the first and second metallic layer are essentially free of oxygen.

BRIEF DESCRIPTION OF THE DRAWINGS

In the drawings, like reference characters generally refer to the same parts throughout the different views. The drawings are not necessarily to scale. Instead emphasis is generally being placed upon illustrating the principles of the invention. In the following description, various embodiments are described with reference to the following drawings.

DETAILED DESCRIPTION

In the following further exemplary embodiments of a method of forming an interconnect and an arrangement for a direct interconnect chip assembly will be explained. It should be noted that the description of specific features described in the context of one specific exemplary embodiment may be combined with others exemplary embodiments as well.

The word "exemplary" is used herein to mean "serving as an example, instance, or illustration". Any embodiment or design described herein as "exemplary" is not necessarily to be construed as preferred or advantageous over other embodiments or designs.

Figure 1:
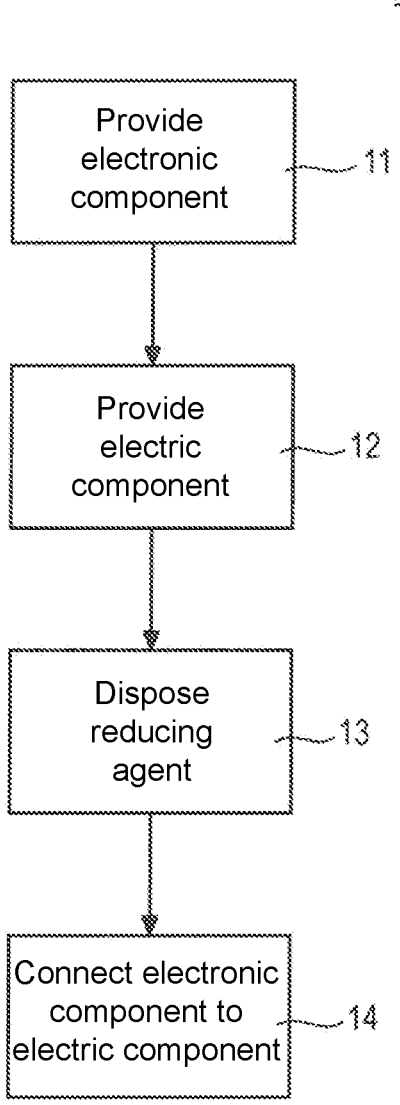
FIG. 1 shows a flowchart of a method of interconnecting an electric component and an electronic component according to an exemplary embodiment.

FIG. 1 shows a flowchart of a method of interconnecting an electric component and an electronic component according to the first aspect. The method 10 comprises providing an electronic component comprising a first main face, and a first metallic layer disposed on the first main face (11), providing an electric component comprising a second main face and a second metallic layer disposed on the second main face, wherein at least one of the first or second metallic layers comprises an oxide layer provided on a main face thereof (12), disposing a reducing agent on one or both of the electronic component and the electric component such that the reducing agent is enabled to remove the oxide layer (13), and connecting the electronic component to the electric component by directly connecting the first layer of the electronic component with the second layer of the electric component by applying pressure and heat (14).

It should be mentioned that the first and second metallic layers are utilized as interconnection sublayers so that in the following the terms "first" and "second interconnection sublayers will be used as synonyms for "first" and "second metallic layers".

Various exemplary embodiments provide a solder-free direct interconnect, in particular for power die mounting, wherein the interconnect is formed by contacting and/or interconnecting a first interconnection sublayer formed on a first electric component and a second interconnection sublayer formed on a second electric component by bringing the two interconnection sublayers in contact and subject the contacted interconnection sublayers to pressure and/or heat. Both of the interconnection sublayers may comprise or may consist of the same interconnection metallic material, e.g. silver, gold, platinum, palladium, aluminum or copper. One of the interconnection sublayers may have a pointed surface while the other one may have a higher plasticity (in particular malleability and/or ductility) than the one interconnection sublayer (having the pointed surface). Optionally the two interconnection sublayers may have a surface roughness and/or waviness which is in the same order of magnitude.

According to an exemplary embodiment of the method, disposing the reducing agent is comprised of coating one or both of the electronic component and the electric component with the reducing agent in the form of a flux layer.

According to an exemplary embodiment of the method, disposing the reducing agent comprises providing the reducing agent in liquid form between the electronic component and the electric component.

According to an exemplary embodiment of the method, disposing the reducing agent comprises providing the reducing agent in form of a gas or vapor between the electronic component and the electric component in a closed process chamber.

According to an exemplary embodiment of the method, disposing the reducing agent and connecting the electronic component to the electric component are conducted in one and the same process chamber.

According to an exemplary embodiment of the method, the first metallic layer comprises a first surface roughness and the second metallic layer comprises a second surface roughness which is different from the first surface roughness. According to an example thereof, the second surface roughness is relatively high and the first surface roughness is relatively low. According to another example thereof, the first surface roughness is relatively high and the second surface roughness is relatively low. A relatively high surface roughness may be defined by an average surface roughness of more than 500 nm, more specifically more than 1 μm, more specifically more than 2 μm. A relatively low surface roughness may be defined by an average surface roughness of less than 200 nm, more specifically less than 100 nm, more specifically less than 50 nm.

According to another exemplary embodiment of the method, the first and second surface roughness can be in the same order of magnitude. In particular, the first and second surface roughness may be in the range of 500 nm to 10 micrometer measured as mean peak to peak distance, preferably in the range of 1 micrometer to 5 micrometer, e.g. in the range of 2 to 3 micrometer. In particular, the term "same order of magnitude" may denote the fact that the surface roughness differ at most by a factor of 5, preferably at most by a factor of 2.5, e.g. by a factor of 2.

In particular, one of the interconnect sublayers may have a malleability which is higher than the malleability of the other of the interconnect sublayers. A good malleable material in this perspective should not exhibit a Vickers hardness or Brinell hardness greater than 5 GPa, preferably lower than 2.5 GPa, e.g. less than 1 GPa.

According to an exemplary embodiment of the method, the method further comprises disposing an adhesion layer below one of the first or second layers comprising the relatively high surface roughness.

According to an exemplary embodiment of the method, pressure and heat are applied from opposing sides of the assembly of the electronic component and the electric component. According to an example thereof, a pressure force is applied onto the electronic component and heat is applied from the electric component side.

According to an exemplary embodiment of the method, the electric component comprises one or more of a substrate,
a carrier,
a leadframe,
a semiconductor wafer,
a chip,
a die,
a chip package,
a directed copper bonded (DCB) substrate, and
an aluminum metal braze (AMB) substrate.

In particular, no solder, no sintering paste or other similar adhesive may be used when contacting and interconnecting the two interconnection sublayers with each other, i.e. the interconnection process may be a solder-free interconnection process. It should be noted that according to one example the metal of the two sublayers is the same, so that a fusing by diffusion is eased.

It should be noted that the term "electrical component" has to be taken in a broad sense, i.e. should encompass any (at least partially) electrically conductive component or element, like a substrate, carrier, leadframe (comprising or consisting of copper, FeNi, so-called alloy42, Mo, MoCu, or the like), DCB (Direct Copper Bonded substrate), DAB (Direct Aluminum Bonded substrate) or the like and as well electronic components, like chips, integrated circuits, (semi-conductor) dies, or the like. DCB substrates are used extensively in the power semiconductor industry. A DCB substrate generally includes a thick ceramic substrate member, to which a thinner top plate of copper and a thinner bottom plate of copper are bonded. A semiconductor die includes one or more power devices such as, for example, power transistors and/or power diodes. Metallization on the back side of this semiconductor die is soldered to the top copper plate of the DCB. The DCB is often physically secured by soldering or welding the top copper plate to a package lead. Bond pads on the front side surface of the die are typically wire bonded to other package leads. The resulting assembly is then encapsulated.

By providing two interconnection sublayers having a surface roughness of the same order of magnitude it may be possible that after interconnecting the two sublayers the ready interconnection may exhibit a high electrical and/or thermal conductivity and/or strength, e.g. by reducing the number of voids arising during connecting the two interconnection sub-layers. In particular, when providing two interconnection sublayers having different levels of plasticity (in particular, ductility or malleability) it may be possible that in a first contacting step (under applying pressure force) the less ductile sublayer (e.g. a pointed one) penetrates the other more ductile sublayer, so that some kind of form fit or positive fit may be achievable. In a second step or stage (heating) a diffusion process may be performed resulting in a good electrical and/or thermal contacting even when the heating is only up to a temperature below the melting temperature of the metal or interconnect material. It should be noted that it may also be possible to initially perform the heating step (to a temperature below the melting point) and afterwards to contact both of the interconnection sublayers while applying pressure to the same. Due to the provision of a solder-free process or method it may be possible to apply the best possible design rules, since no or only very few squeeze out of material may be present. Furthermore, no processing of the backside or backend of the electronic components may be necessary and the second interconnection sublayer may be formed on a standard rough backside, e.g. a three layer backside including a barrier layer.

In the following exemplary embodiments of the method of forming an interconnection are described. However, the features and elements described with respect to these embodiments can be combined with exemplary embodiments of the arrangement or set for a direct interconnect chip assembly.

According to an exemplary embodiment of the method the electric component and the electronic component have a plasticity which is lower than the plasticity of the first interconnection sublayer and second interconnection sublayer. In other words the electronic component and the electric component may both be harder or less ductile than the sublayers of the interconnection layer. It should be noted that in particular, the portions of the electric component and/or the electronic component on which the first interconnection sub-layer and the second interconnection layer, respectively are arranged or deposited may be less ductile than the respective interconnection sublayers. By providing interconnection sub-layers on the components to be interconnected having a higher plasticity (malleability) than the components below it may be possible to ensure that primarily the interconnection sublayers may be deformed when pressure is applied during the interconnection process or step.

According to an exemplary embodiment of the method the first interconnection sublayer and the second interconnection sublayer have a different plasticity.

For example, one of the interconnection sublayers may comprise or may (at least partially) consists of a monocrystalline metal, e.g. silver, while the other one may comprise or (at least partially) consist of a microcrystalline metal, e.g. silver. For example, the microcrystalline layer may be formed by sputtering while the monocrystalline layer may be formed by an electrochemical plating process.

By providing interconnection sublayers having different plasticity it may be possible that during the contacting step the one sublayer having the lower plasticity or higher hardness penetrates the other interconnection sublayer having the higher plasticity so that already due to the pressure a kind of form fit or positive fit may be achievable to some extend which may increase the interconnection quality.

According to an exemplary embodiment of the method the electric component is one element out of the group consisting of: a substrate; a carrier, a leadframe; a semiconductor wafer; a chip; a (semiconductor) die; and a chip package. In particular, the semiconductor wafer, the chip and the die may comprise or predominantly consist of silicon and/or III-V or II-VI compound semiconductor material.

For example, the second interconnection sublayer may be formed on the backside of the electronic component, e.g. chip or die. It should be noted that the electronic component may comprise a plurality or array of single chips or dies or a plurality of electronic components may be interconnected in a batch process. Furthermore, it should be noted that more than the described two components may be stacked on each other, e.g. a stack may be formed comprising two electric components and one or two electronic components. In general, a plurality of pairs of electric components and electronic components may be stacked on top of each other using the described interconnection method.

According to an exemplary embodiment of the method the first interconnection sublayer comprises a plurality of electrically separated portions.

In particular, the electric component, e.g. a carrier or substrate, may form a carrier for a fine pitch interconnection of a power die mounting or the like. Due to the use of a solder-free interconnection it may be possible to provide an interconnection having a fine pitch, since no solder is squeezed out when forming the interconnection. Thus, it may also possible to use or apply the best possible design rules.

According to an exemplary embodiment of the method at least one of the first interconnection sublayer and the second interconnection sublayer are formed by a process selected out of the group consisting of: sputtering, physical vapor deposition, plating, electro plating, evaporation, and electrochemical plating.

In particular, electrochemical plating may be a suitable process for forming at least one of the interconnection sublayers, since the dimensions, thickness and/or roughness of the same may be controllable by adjusting pulse form, pulse width and/or pulse length. However, it should be noted that preferably the forming of the first and second interconnection sublayer may not comprise a sintering step, i.e. the forming of these sublayers may be a sintering-free process, in particular, the whole interconnection method may be free of any sintering steps or processes involving individual particles.

According to an exemplary embodiment of the method the first interconnection sublayer and the second interconnection sublayer are formed by different processes.

In particular, one of the interconnection sublayers may be formed by sputtering while the other one may be formed by a plating process, e.g. an electro or electrochemical plating process. The use of different processes may be an efficient way to provide interconnection sublayers having a different level of plasticity.

According to an exemplary embodiment of the method, the second interconnection sublayer is formed on a plurality of electronic components.

In particular, the plurality or array of electronic components may comprise or may consist of housed or unhoused integrated circuits (e.g. power transistors, power diodes, power modules or the like), (semiconductor) dies or the like. Thus, the interconnection method may form a batch process in which a plurality of single electronic components or elements, e.g. dies, may be connected in a single process step. Alternatively, the electronic component may comprise or may be formed by a single electronic component, e.g. a (power) die.

According to an exemplary embodiment of the method, during the interconnection the interconnection sub-layers are heated to a temperature below a melting point of the metal.

In particular, during the whole interconnection process the temperature is always kept below the melting point or melting temperature of the metal or interconnect material. Thus, it may be possible to avoid or at least drastically reduce the amount of melting and/or squeezing out of metal of the interconnection sublayers during the interconnection process. In particular, the interconnection process may be a cold or solid-solid diffusion interconnection process or step.

According to an exemplary embodiment the method further comprises forming a barrier layer between the electronic component and the second interconnection sublayer and comprising at least one material selected out of the group consisting of: tungsten, chromium, molybdenum, titanium, vanadium, and nickel.

According to an exemplary embodiment the method further comprises attaching at least one of the electric component and the electronic component to a transfer tape before interconnecting the first and the second interconnection sublayers.

In particular, the electronic component or a plurality of electronic components may be attached to one transfer tape. Preferably the transfer tape is attached to the front side of the electronic component. Additionally, the electric component or a plurality of electric components may be optionally attached to another transfer tape.

According to an exemplary embodiment the method further comprises removing the transfer tape after interconnecting the first and the second interconnection sublayers.

According to an exemplary embodiment of the method, at least one of the first interconnection sublayer and the second interconnection sublayer comprises a pointed surface.

In particular, one of the interconnection sub-layers may have a pointed surface. For example, the pointed surface may be formed on the electronic component, e.g. a backside of a chip or die.

In particular, it should be noted that the interconnection method may be a solder-free method and/or that the first and second interconnection sublayer may be formed without a sintering step.

In the following specific embodiments of the method of forming an interconnection between an electric component and an electronic component will be described in more detail with respect to the figures.

Figure 2A:
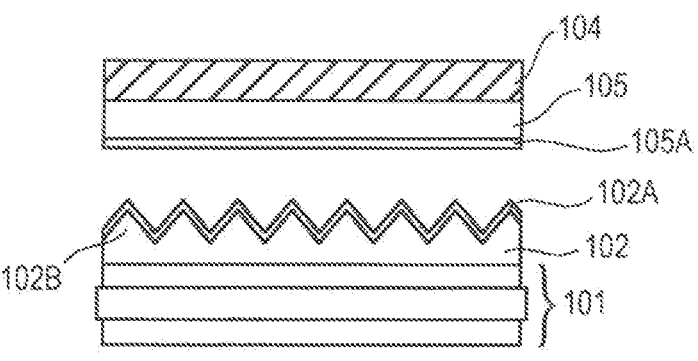
FIGS. 2A to 2D schematically show a method of interconnecting an electric component and an electronic component according to an exemplary embodiment in which the metallic layer of the electric component comprises a higher surface roughness than the metallic layer of the electronic component.

FIGS. 2A to 2D schematically illustrate a method of interconnecting an electric component and an electronic component 100 according to an exemplary embodiment. In particular, FIG. 2A shows an electric component, e.g. a DCB 101, on which a first interconnection sublayer 102, comprising or consisting of a metal, e.g. silver, gold or copper, is formed, wherein silver may be preferred due to its high thermal and electrical conductivity which may enable a significant miniaturization potential. Furthermore, the use of silver may enable reduction of process costs and reduced stress potential when compared to known AuSn (gold-tin) diffusion solder processes. In addition, the use of silver may reduce potential issues with unreacted Sn due to reflow in a tin-rich solder system using CuSn intermetallic phases (copper-tin). The first interconnection sublayer 102 comprises surface structures 102B (schematically indicated by an undulating surface) resulting in a relatively high surface roughness. The first interconnection sublayer 102 further comprises a first oxide layer 102A on its upper main face.

Furthermore, FIG. 2A shows an electronic component 104, e.g. a chip, die or the like, on which a second interconnection sublayer 105, comprising or consisting of the same metal as the first interconnection sublayer 102, is formed. The second interconnection sublayer 105 may also have some surface structures (not shown) resulting in a relatively low surface roughness, wherein the surface roughness of the second interconnection sublayer 105 can be lower than the surface roughness of the first interconnection sublayer 102.

For example, the second interconnection sublayer 105 may be formed by a sputtering process to the backside of the electronic component 104 leading to a fine- or microcrystalline structure, while the first interconnection sublayer 102 may be formed by a plating process, e.g. an electrochemical plating process, which may result in a more ductile (e.g. monocrystalline) structure than the sputtered second interconnection sublayer 105. The first interconnection sublayer 102 may form a coating on the electric component and/or the second interconnection sublayer 105 may form a coating on the electronic component 104. The second interconnection sublayer 105 comprises a second oxide layer 105A on its lower main face.

Figure 2B:
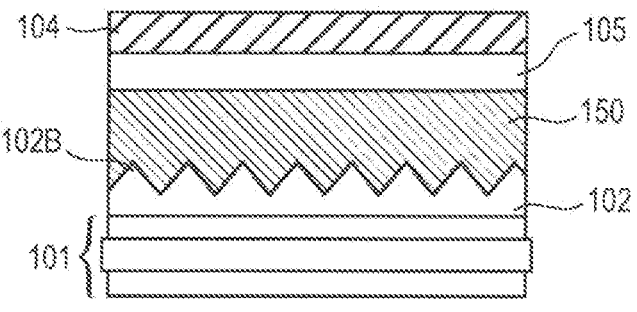

FIG. 2B illustrates a subsequent step of the method, in which a reducing agent 150 is disposed in between the first and second interconnection sublayers 102 and 105 in order to reduce the oxide layers 102A and 105A. The reducing agent 150 can be any common reducing agent as, for example, one or more of Lithium aluminum hydride (Li-AlH4), Nascent (atomic) hydrogen, Hydrogen without or with a suitable catalyst e.g. a Lindlar catalyst, Sodium amalgam (Na(Hg)), Sodium-lead alloy (Na+Pb), Zinc amalgam (Zn(Hg)) (reagent for Clemmensen reduction), Diborane Sodium borohydride (NaBH4), Compounds containing the Fe2+ ion, such as iron(II) sulfate, Compounds containing the Sn2+ ion, such as tin(II) chloride, Sulfur dioxide, Sulfite compounds, Dithionates, e.g. Na2S2O6 Thiosulfates, e.g. Na2S2O3 (mainly in analytical chemistry), Iodides, e.g. KI (mainly in analytical chemistry), Hydrogen peroxide (H2O2) (typically in analytical chemistry), Hydrazine (Wolff-Kishner reduction), Diisobutylaluminium hydride (DIBAL-H), Oxalic acid (C2H2O4), Formic acid (HCOOH), Ascorbic acid (C6H8O6), Reducing sugars, Phosphites, hypophosphites, and phosphorous acid Dithiothreitol (DTT) (used in biochemistry labs to avoid S—S bonds), Carbon monoxide (CO), Cyanides in hydrochemical metallurgical processes, Carbon (C), Tris-2-carboxyethylphosphine hydrochloride (TCEP).

The application of the reducing agent 150 can be done by coating one or both of the components with a flux layer or providing the agent in liquid form between the electric and the electronic components or applying the reducing agent in form of a gas or vapor in a closed process chamber. In addition the assembly can be heated during this process to activate the reducing agent 150. As a result, the metal oxide layers 102A and 105A are reduced to pure, reactive layers of metal.

Figure 2C:
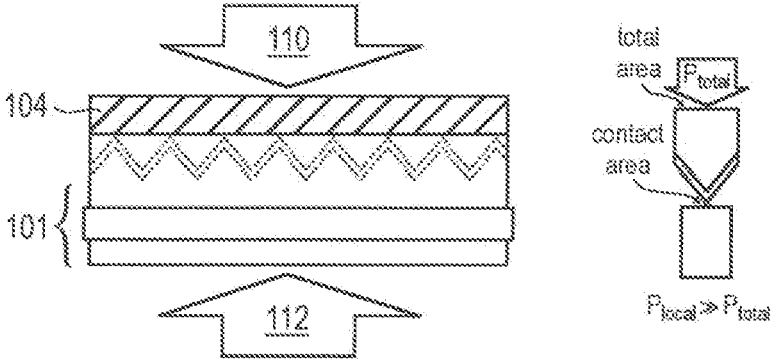

FIG. 2C (left part) illustrates a subsequent step of the method, in which the two interconnection sublayers 102 and 105 are brought into contact by applying a pressure force and heat). As indicated by the arrows 110 and 112, the force can be applied from above and the heat can be applied from below wherein applying the force may be done by subjecting the stack shown in FIG. 2B to a press. Due to the pressure applied and the pointed surface of the first interconnection sublayer 102 the same deforms and penetrates into the second interconnection sublayer 105. A force is applied which is sufficient to locally overcome the yield stress of the malleable material of the second interconnection sublayer 105 in the areas of contact between the pointed surfaces of the first interconnection sublayer 102 and the second interconnection sublayer 105. The right part of FIG. 2C shows that due to the pointed surfaces the local pressure exerted on a contact area can be much higher than the total pressure applied on the overall assembly.

The applied temperature has to be below any one of the melting temperatures of the materials of the overall assembly, in particular below the melting temperatures of the metals of the interconnection sublayers, which means that the applied temperature can be in a range from 150° C. to 250° C. The assembly is heated to enable the interdiffusion of the metals and the formation of an integral joint, i.e. mixing of the metals of the first and second interconnection sublayers 102 and 105. In case of different metallic materials an intermetallic phase layer may be formed between the first and second interconnection sublayers 102 and 105.

It should be noted that no solder is added or applied in the method or process depicted in FIGS. 2A-2D, i.e. the described method is a solder-free method or process.

Figure 2D:
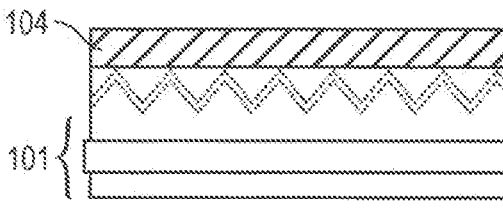

FIG. 2D shows the fabricated arrangement after the interdiffusion step has taken place. In particular, the interdiffusion has the effect that the former boundary between the two interconnection sublayers disappears and the former two interconnection sublayers form a single interconnection layer. The fabricated arrangement is shown for a case in which the metallic materials of the two interconnection sublayers are identical. However, in case of different metallic materials an intermetallic phase layer may be formed at the former boundary between the two interconnection sublayers.

Optionally, a transfer tape may be attached to the front side of the electronic component and/or to the electric component. Furthermore, it should be noted that additional layers, e.g. barrier layers, may optionally be formed between the electronic component and the second interconnection sublayer.

It should be noted that it is readily possible to interconnect more than two components stacked above each other in the same way as it is described. For example, for an assembly with an electronic component arranged between two electric components the electric component preferably then exhibit the described layer structure and an interconnection sublayer on both sides opposite the interconnection sublayers of the electric components on top and bottom of the electronic component.

Figure 3A:
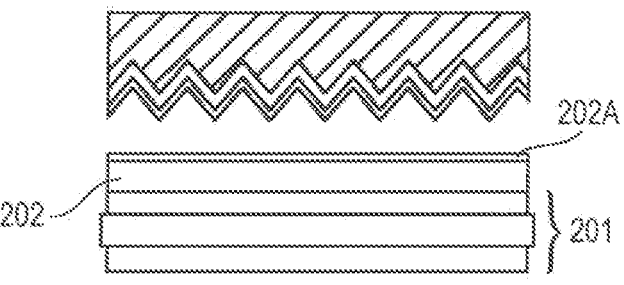
FIGS. 3A to 3D schematically show a method of interconnecting a plurality of electric components and electronic components according to an exemplary embodiment in which the metallic layer of the electronic component comprises a higher surface roughness than the metallic layer of the electric component.
Figure 3B:
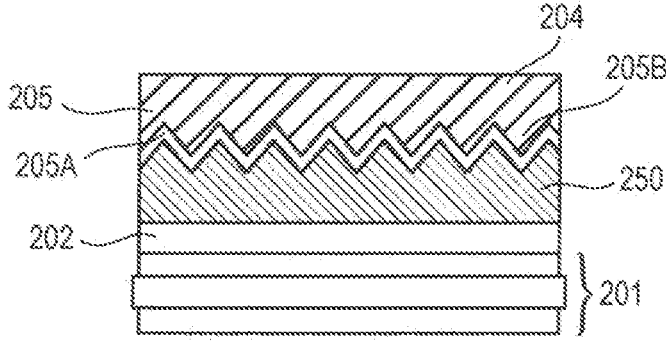
Figure 3C:
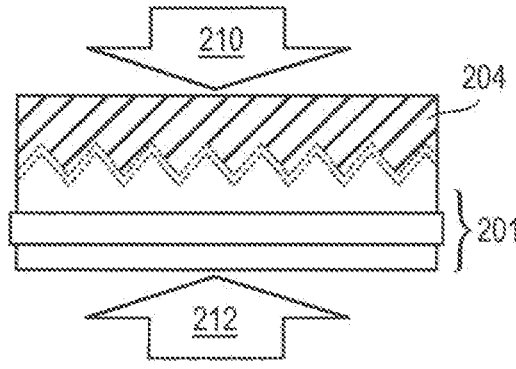
Figure 3D:
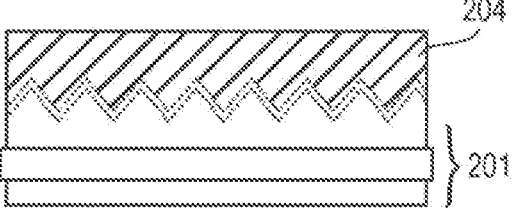

FIGS. 3A to 3D schematically illustrate a method of interconnecting an electric component and an electronic component 100 according to an exemplary embodiment. In particular, this exemplary embodiment works along the same principles as the embodiment of FIGS. 2A-2D so that the details will not be repeated here. The only difference to the exemplary embodiment of FIGS. 2A-2D is that in the exemplary embodiment of FIGS. 3A-3D the interconnection sublayer of the electronic component, in particular a silicon die, has a higher surface roughness than the interconnection sublayer of the electric component, in particular a DCB substrate. In particular, the assembly as shown in FIG. 3A comprises a DCB substrate 201, a first interconnection sublayer 202 disposed on an upper main face of the DCB 201 and having a relatively low surface roughness and comprising a first oxide layer 202A on an upper main face thereof, a silicon die 204, a second interconnection sublayer 205 disposed on a lower main face of the silicon die 204 and having a relatively high surface roughness and comprising a second oxide layer 205A on a lower main face thereof. A reducing agent 250 will be disposed between the two components in order to reduce the two oxide layers 202A and 205A (FIG. 2B). Pressure and heat will be applied to the assembly as indicated by the arrows 210 and 212 in order to interconnect the two components (FIG. 3C) and to finally obtain the interconnected arrangement (FIG. 3D).

In the following a fabricated arrangement according to the second aspect will be described.

The arrangement of FIGS. 2D and 3D comprises an electric component 101, 201 comprising a first main face and a first metallic layer 102, 202 disposed on the first main face, an electronic component 104, 204 comprising a second main face and a second metallic layer 105, 205 disposed on the second main face, wherein the electronic component 104, 204 is connected to the electric component 101, 201 wherein the first metallic layer of the electronic component is directly connected with the second metallic layer of the electric component, and wherein the first and second metallic layer are essentially free of oxygen.

According to an exemplary embodiment of the arrangement the first and second metallic layers comprise identical metallic materials.

According to an exemplary embodiment of the arrangement the first and second metallic layers comprise different metallic materials. According to a further example thereof, the arrangement further comprises an intermetallic phase layer between the first and second interconnection sublayers.

According to an exemplary embodiment of the arrangement the electric component comprises one or more of a substrate, a carrier, a leadframe, a semiconductor wafer, a chip, a die, a chip package, a directed copper bonded (DCB) substrate, and an aluminum metal braze (AMB) substrate.

According to an exemplary embodiment the arrangement further comprises a plurality of electronic components each comprising a second interconnection sublayer.

In particular, the plurality of electronic components, e.g. (power) transistors, (power) diodes, or the like, may form or build an array of electronic components or elements.

According to an exemplary embodiment the arrangement further comprises a transfer tape.

In particular, the electronic component or a plurality of electronic components may be attached or mounted to the transfer tape. Alternatively, the (front side of the) electric component or a plurality of electric components may be attached to the transfer tape. Optionally, the electronic com-ponent(s) and the electric component(s) are attached to a first and second transfer tape, respectively.

According to an exemplary embodiment of the arrangement, the first and second interconnect sublayers comprise different plasticities or malleabilities.

In particular, the first interconnection sublayer and the second interconnection sublayer may be interconnected to each other. Thus, it may be possible that the arrangement forms a stack of two components, i.e. the electric component and the electronic component interconnected to each other. Such a stack may form an electronic module, a chip package or the like.

According to an exemplary embodiment the arrangement further comprising at least a further electric component which is stacked on the electronic component.

In particular, a plurality of further electric component(s) and/or further electronic components may be provided. Thus, a stack may be formed comprising a plurality of electronic components and electric components. That is, it is readily possible to interconnect more than two components stacked above each other.

The following examples pertain to further aspects of the disclosure:

Example 1 is a method of forming an interconnection between an electric component and an electronic component, the method comprising:

providing an electronic component comprising a first main face, and a first metallic layer disposed on the first main face;

providing an electric component comprising a second main face and a second metallic layer disposed on the second main face;

wherein at least one of the first or second metallic layers comprises an oxide layer provided on a main face thereof;

disposing a reducing agent on one or both of the electronic component and the electric component such that the reducing agent is enabled to remove the oxide layer; and connecting the electronic component to the electric component by directly connecting the first layer of the electronic component with the second layer of the electric component by applying pressure and heat.

In Example 2, the subject matter of Example 1 can optionally include disposing the reducing agent is comprised of coating one or both of the electronic component and the electric component with the reducing agent in the form of a flux layer.

In Example 3, the subject matter of Example 1 can optionally include disposing the reducing agent is comprised of providing the reducing agent in liquid form between the electronic component and the electric component.

In Example 4, the subject matter of Example 1 can optionally include disposing the reducing agent is comprised of providing the reducing agent in form of a gas or vapor between the electronic component and the electric component in a closed process chamber.

In Example 5, the subject matter of any one of the preceding Examples can optionally include disposing the reducing agent and connecting the electronic component to the electric component are conducted in one and the same process chamber.

In Example 6, the subject matter of any one of the preceding Examples can optionally include wherein the first and second metallic layers have a different malleability.

In Example 7, the subject matter of any one of the preceding Examples can optionally include wherein the first metallic layer comprises a first surface roughness and the second metallic layer comprises a second surface roughness which is different from the first surface roughness.

In Example 8, the subject matter of Example 7 can optionally include wherein the second surface roughness is relatively high and the first surface roughness is relatively low.

In Example 9, the subject matter of Example 7 can optionally include further comprising the first surface roughness is relatively high and the second surface roughness is relatively low.

In Example 10, the subject matter of any one of the preceding Examples can optionally include further comprising disposing an adhesion layer below one of the first or second layers comprising the relatively high surface roughness.

In Example 11, the subject matter of any one of the Examples 7 to 10 can optionally include wherein a relatively high surface roughness is defined by an average surface roughness of more than 500 nm, more specifically more than 1 μm, more specifically more than 2 μm.

In Example 12, the subject matter of any one of the Examples 7 to 11 can optionally include wherein a relatively low surface roughness is defined by an average surface roughness of less than 200 nm, more specifically less than 100 nm, more specifically less than 50 nm.

In Example 13, the subject matter of any one of the preceding Examples can optionally include wherein pressure and heat are applied from opposing sides of the assembly of the electronic component and the electric component.

In Example 14, the subject matter of Example 13 can optionally include a pressure force is applied onto the electronic component and heat is applied from the electric component side.

In Example 15, the subject matter according to any one of the preceding Examples can optionally include wherein the electric component comprises one or more of a substrate,
a carrier,
a leadframe,
a semiconductor wafer,
a chip,
a die,
a chip package,
a directed copper bonded (DCB) substrate, and an aluminum metal braze (AMB) substrate.

Example 16 an arrangement for a direct interconnect assembly, the arrangement comprising:

an electronic component comprising a first main face and a first metallic layer disposed on the first main face;

an electric component comprising a second main face and a second metallic layer disposed on the second main face; wherein the electronic component is connected to the electric component wherein the first metallic layer of the electronic component is directly connected with the second metallic layer of the electric component; and wherein the first and second metallic layer are essentially free of oxygen.

In Example 17, the subject matter of Example 16 can optionally include wherein the first and second metallic layers comprise identical metallic materials.

In Example 18, the subject matter of Example 16 can optionally include wherein the first and second metallic layers comprise different metallic materials.

In Example 19, the subject matter of Example 18 can optionally include further comprising an intermetallic phase layer between the first and second metallic layers.

In Example 20, the subject matter of any one of the Examples 16 to 19 can optionally include wherein the electric component comprises one or more of a substrate,
a carrier,
a leadframe,
a semiconductor wafer,
a chip,
a die,
a chip package,
a directed copper bonded (DCB) substrate, and
an aluminum metal braze (AMB) substrate.

It should also be noted that the term "comprising" does not exclude other elements or features and the "a" or "an" does not exclude a plurality. Also elements described in association with different embodiments may be combined. It should also be noted that reference signs shall not be construed as limiting the scope of the claims. While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A method of forming an interconnection, the method comprising:

providing an electronic component comprising a first main face, and a first metallic layer disposed on the first main face;

providing an electric component comprising a second main face and a second metallic layer disposed on the second main face, at least one of the first or second metallic layers comprising an oxide layer provided on a main face thereof;

disposing a reducing agent on one or both of the electronic component and the electric component such that the reducing agent is enabled to remove the oxide layer; and connecting the electronic component to the electric component by directly connecting the first metallic layer of the electronic component with the second metallic layer of the electric component by applying pressure and heat, wherein the first and second metallic layers have a different malleability, wherein the first metallic layer comprises a first surface roughness and the second metallic layer comprises a second surface roughness which is different from the first surface roughness.

2. The method of claim 1, wherein disposing the reducing agent and connecting the electronic component to the electric component are conducted in one and the same process chamber.

3. The method of claim 1, wherein the pressure and heat are applied from opposing sides of an assembly of the electronic component and the electric component.

4. The method of claim 3, wherein the pressure is applied onto the electronic component and the heat is applied from the electric component side.

5. The method of claim 1, wherein the electric component comprises one or more of:

a substrate;

a carrier;

a leadframe;

a semiconductor wafer;

a chip;

a die;

a chip package;

a directed copper bonded (DCB) substrate; and an aluminum metal braze (AMB) substrate.

6. The method of claim 1, wherein a first one of the first and second metallic layers has a pointed surface, and wherein a second one of the first and second metallic layers has a higher malleability than the first one of the first and second metallic layers.

7. The method of claim 1, wherein each of the first and second metallic layers are formed by one of: sputtering, physical vapor deposition, plating, electro plating, evaporation, and electrochemical plating.

8. The method of claim 7, wherein one of the first and second metallic layers is formed by electroplating or electrochemical plating.

9. The method of claim 1, wherein disposing the reducing agent comprises:

coating one or both of the electronic component and the electric component with the reducing agent in a form of a flux layer.

10. The method of claim 1, wherein the second surface roughness is relatively high and the first surface roughness is relatively low.

11. The method of claim 10, wherein the relatively high surface roughness of the second surface roughness is defined by an average surface roughness of more than 500 nm, more than 1 μm, or more than 2 μm.

12. The method of claim 10, wherein the relatively low surface roughness of the first surface roughness is defined by an average surface roughness of less than 200 nm, less than 100 nm, or less than 50 nm.

13. The method of claim 1, wherein the first surface roughness is relatively high and the second surface roughness is relatively low.

14. The method of claim 13, wherein the relatively high surface roughness of the first surface roughness is defined by an average surface roughness of more than 500 nm, more than 1 μm, or more than 2 μm.

15. The method of claim 13 wherein the relatively low surface roughness of the second surface roughness is defined by an average surface roughness of less than 200 nm, less than 100 nm, or less than 50 nm.

16. The method of claim 1, further comprising:

disposing an adhesion layer below one of the first or second metallic layers comprising a relatively high surface roughness.

\* \* \* \* \*